(12) United States Patent
Chang et al.

(10) Patent No.: US 9,177,797 B2
(45) Date of Patent: Nov. 3, 2015

(54) LITHOGRAPHY USING HIGH SELECTIVITY SPACERS FOR PITCH REDUCTION

(71) Applicant: Taiwan Semiconductor Manufacturing Company, Ltd., Hsin-Chu (TW)

(72) Inventors: Yu-Sheng Chang, Taipei (TW);
Chung-Ju Lee, Hsin-Chu (TW);
Cheng-Hsiung Tsai, Zhunan Township (TW); Yung-Hsu Wu, Taipei (TW);
Hsiang-Huan Lee, Jhudong Township (TW); Hai-Ching Chen, Hsin-Chu (TW); Ming-Feng Shieh, Yongkang (TW); Tien-I Bao, Dayuan Township (TW); Ru-Gun Liu, Zhubei (TW);
Tsai-Sheng Gau, HsinChu (TW);
Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 21 days.

(21) Appl. No.: 14/096,864

(22) Filed: Dec. 4, 2013

(65) Prior Publication Data

US 2015/0155171 A1 Jun. 4, 2015

(51) Int. Cl.
*H01L 21/311* (2006.01)
*H01L 21/033* (2006.01)

(52) U.S. Cl.
CPC ............................ *H01L 21/0338* (2013.01)

(58) Field of Classification Search
CPC ....... H01L 21/84; H01L 29/66; H01L 21/302; H01L 21/461; H01L 21/033

USPC .......................................... 438/158, 689, 703
See application file for complete search history.

(56) References Cited

U.S. PATENT DOCUMENTS

| | | | | |
|---|---|---|---|---|
| 5,328,810 A * | 7/1994 | Lowrey et al. | ................. | 430/313 |
| 6,063,688 A * | 5/2000 | Doyle et al. | ................... | 438/424 |
| 6,239,008 B1 * | 5/2001 | Yu et al. | ......................... | 438/587 |
| 7,393,789 B2 * | 7/2008 | Abatchev et al. | ............. | 438/692 |
| 7,759,197 B2 * | 7/2010 | Tran | .............................. | 438/267 |
| 7,807,575 B2 * | 10/2010 | Zhou | ............................. | 438/696 |
| 7,884,022 B2 * | 2/2011 | Bai et al. | ........................ | 438/702 |
| 7,902,074 B2 * | 3/2011 | Niroomand et al. | .......... | 438/702 |
| 7,910,288 B2 * | 3/2011 | Abatchev et al. | ............. | 430/313 |
| 8,048,813 B2 * | 11/2011 | Lai et al. | ....................... | 438/736 |
| 8,207,576 B2 * | 6/2012 | Tran et al. | ..................... | 257/332 |
| 8,518,836 B1 * | 8/2013 | Tsai et al. | ..................... | 438/780 |
| 8,546,202 B2 * | 10/2013 | Tung et al. | .................... | 438/151 |
| 8,778,807 B2 * | 7/2014 | Lai et al. | ....................... | 438/736 |
| 8,836,083 B2 * | 9/2014 | Zhou | ............................. | 257/618 |
| 8,883,644 B2 * | 11/2014 | Wells et al. | ................... | 438/689 |

(Continued)

*Primary Examiner* — Caleb Henry
(74) *Attorney, Agent, or Firm* — Slater & Matsil, L.L.P.

(57) ABSTRACT

A method embodiment for patterning a semiconductor device includes patterning a dummy layer over a hard mask to form one or more dummy lines. A sidewall aligned spacer is conformably formed over the one or more dummy lines and the hard mask. A first reverse material layer is formed over the sidewall aligned spacer. A first photoresist is formed and patterned over the first reverse material layer. The first reverse material layer using the first photoresist as a mask, wherein the sidewall aligned spacer is not etched. The one or more dummy lines are removed, and the hard mask is patterned using the sidewall aligned spacer and the first reverse material layer as a mask. A material used for forming the sidewall aligned spacer has a higher selectivity than a material used for forming the first reverse material layer.

20 Claims, 13 Drawing Sheets

(56) References Cited

U.S. PATENT DOCUMENTS

| | | | |
|---|---|---|---|
| 8,900,937 B2* | 12/2014 | Lin et al. | 438/157 |
| 8,901,700 B2* | 12/2014 | Parekh et al. | 257/506 |
| 8,980,756 B2* | 3/2015 | Tran et al. | 438/703 |
| 9,003,651 B2* | 4/2015 | Abatchev et al. | 29/844 |
| 9,035,416 B2* | 5/2015 | Fischer et al. | 257/499 |
| 9,048,194 B2* | 6/2015 | Zhu | 1/1 |
| 9,059,001 B2* | 6/2015 | Liu et al. | 1/1 |
| 2006/0046201 A1* | 3/2006 | Sandhu et al. | 430/314 |
| 2006/0046484 A1* | 3/2006 | Abatchev et al. | 438/689 |
| 2007/0026684 A1* | 2/2007 | Parascandola et al. | 438/733 |
| 2007/0049040 A1* | 3/2007 | Bai et al. | 438/712 |
| 2008/0008969 A1* | 1/2008 | Zhou et al. | 430/313 |
| 2008/0248429 A1* | 10/2008 | Chou et al. | 430/311 |
| 2009/0032963 A1* | 2/2009 | Tran | 257/774 |
| 2009/0101995 A1* | 4/2009 | Beintner et al. | 257/412 |
| 2009/0233238 A1* | 9/2009 | Hsu et al. | 430/312 |
| 2009/0258500 A1* | 10/2009 | Yang et al. | 438/703 |
| 2010/0144153 A1* | 6/2010 | Sills et al. | 438/696 |
| 2011/0097863 A1* | 4/2011 | Shieh et al. | 438/268 |
| 2011/0130006 A1* | 6/2011 | Abatchev et al. | 438/703 |
| 2012/0126325 A1* | 5/2012 | Wang et al. | 257/365 |
| 2012/0126326 A1* | 5/2012 | Wang et al. | 257/365 |
| 2012/0202350 A1* | 8/2012 | Sant et al. | 438/703 |
| 2012/0282778 A1* | 11/2012 | Light et al. | 438/703 |
| 2013/0154004 A1* | 6/2013 | Liu et al. | 257/347 |
| 2013/0157462 A1* | 6/2013 | Lee et al. | 438/685 |
| 2013/0171784 A1* | 7/2013 | Tran | 438/257 |
| 2013/0217233 A1* | 8/2013 | Chang et al. | 438/702 |
| 2013/0244436 A1* | 9/2013 | Sandhu | 438/702 |
| 2014/0017894 A1* | 1/2014 | Tsai et al. | 438/694 |
| 2015/0111380 A1* | 4/2015 | Chang et al. | 438/674 |

* cited by examiner

US 9,177,797 B2

LITHOGRAPHY USING HIGH SELECTIVITY SPACERS FOR PITCH REDUCTION

BACKGROUND

With the increasing down-scaling of semiconductor devices, various processing techniques, such as, photolithography are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

One approach used to achieve the higher resolutions to manufacture, for example, 40 nm or smaller devices, is to use multiple pattern lithography. For example, a "half pitch" (half of the minimum photolithographic pitch achievable in a traditional photolithography system) can be achieved by forming dummy lines (e.g., at a minimum available pitch), forming sidewall aligned spacers on the dummy lines, removing the dummy lines while leaving the spacers, and then using the spacers as patterning masks to transfer the desired pattern to underlying layers. In this manner, line spacing at approximately half the minimum pitch can be achieved.

The disposition of additional materials (e.g., reverse material layers) for additional lithography patterning and cutting may be performed on the spacers prior to the removal of the dummy lines. This additional patterning/cutting allows for greater variation and/or more complex patterns to be formed in semiconductors for back end of line (BEOL) processes with small pitches. However, traditional techniques for additional patterning/cutting rely on multiple planarization steps, which increase the achievable process window and increase manufacturing cost.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Various embodiments provide a method for patterning a semiconductor device layer by transferring a pattern to a hard mask disposed over the semiconductor device layer. Dummy lines are formed over the hard mask. The dummy lines may be spaced apart at a minimum pitch that a photolithographic system can achieve. A sidewall aligned spacer is conformably deposited over the dummy lines. The sidewall aligned spacer comprises a high selectivity material such as titanium nitride or titanium oxide.

In order to form additional patterns (e.g., of a different width than the spacer and/or more complex patterns that may include patterns in a different direction than the spacer/dummy lines), reverse material layers are formed and patterned over the spacer. For example, two reverse material layers may be formed and patterned over the spacer for complex patterns. The first reverse material layer may be patterned using a selective etching process using a patterned photoresist formed over the reverse material layer as a mask. Because the spacer is formed of a high selectivity material, the etching of the first reverse material layer does not etch the spacer. The patterning of the first reverse material layer may be done to transfer patterned lines of different widths than the spacer to the hard mask. The patterning of a second reverse material layer may be done to transfer a more complex pattern, for example, running in a direction perpendicular to the spacer/dummy lines to the hard mask. Alternatively, for less complex patterns, the second reverse material layer may be excluded.

An etch back may then be performed to expose the dummy lines, which are then removed. The hard mask is then patterned using the spacer and reverse material layers as a mask. Because the spacer was formed along both sidewalls of the dummy lines, the spacer may be patterned at about half the pitch of the dummy lines. Furthermore, due to the high selectivity of the spacer, the reverse material layers may be etched directly compared to traditional methods, which rely on multiple planarization steps. Thus, the number of process steps needed to pattern the reverse material layers are lowered, reducing manufacturing cost and improving process reliability.

Figure 1:
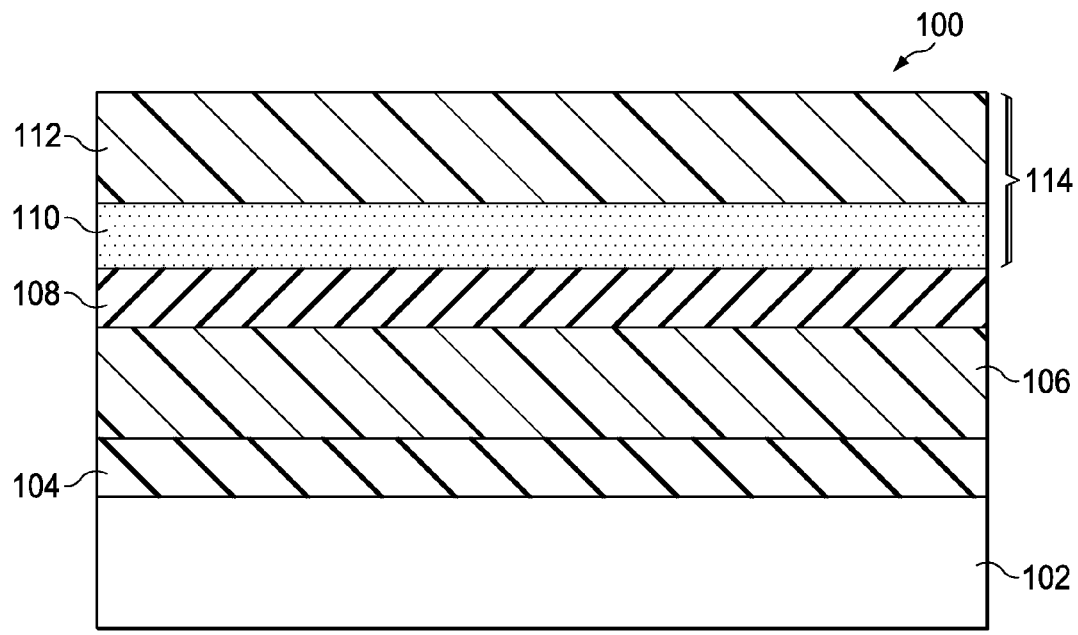
FIGS. 1 through 17B illustrate various cross-sectional and elevation views of intermediate stages of patterning a hard mask in accordance with various embodiments.

FIG. 1 illustrates a cross-sectional view of a portion of a semiconductor device 100 in accordance with various embodiments. Semiconductor device 100 includes a layer 102 that requires patterning. Layer 102 may be a metallic layer (e.g., copper, aluminum, and the like), a dielectric layer, a polymer layer, a substrate (e.g., silicon), or any other layer of a semiconductor device that may be patterned using photolithography and etching techniques. A hard mask 104 is disposed over layer 102. Hard mask 104 may be formed of any suitable material such as silicon oxynitride (SiON), silicon nitride ($Si_3N_4$), titanium nitride (TiN) or the like. Hard mask 104 may be formed by chemical vapor deposition (CVD), low pressure CVD, plasma enhanced CVD, or the like. In subsequent process steps, a pattern is transferred onto hard mask 104 using various photolithography and etching techniques. Hard mask 104 may then be used as a patterning mask for etching underlying layer 102.

A dummy layer 106 is disposed over hard mask 104. Dummy layer 106 may be etched to form dummy line patterns for the formation of sidewall aligned spacers in multiple pattern lithography. Dummy layer 105 may be a polymer, an ashable hard mask (e.g., amorphous carbon film or amorphous silicon film), polysilicon, or any other material that may be patterned and selectively removed.

A bi-layer photoresist 114 may be formed over dielectric hard mask layer 108, which may comprise a hard mask material such as a nitride (e.g., SiON). Bi-layer photoresist includes a top photoresist layer 112, and a bottom layer 110, which may include anti-reflective materials (e.g., a bottom anti-reflective coating (BARC) layer) to aid the exposure and focus of the top photoresist layer 112's processing.

Figure 2:
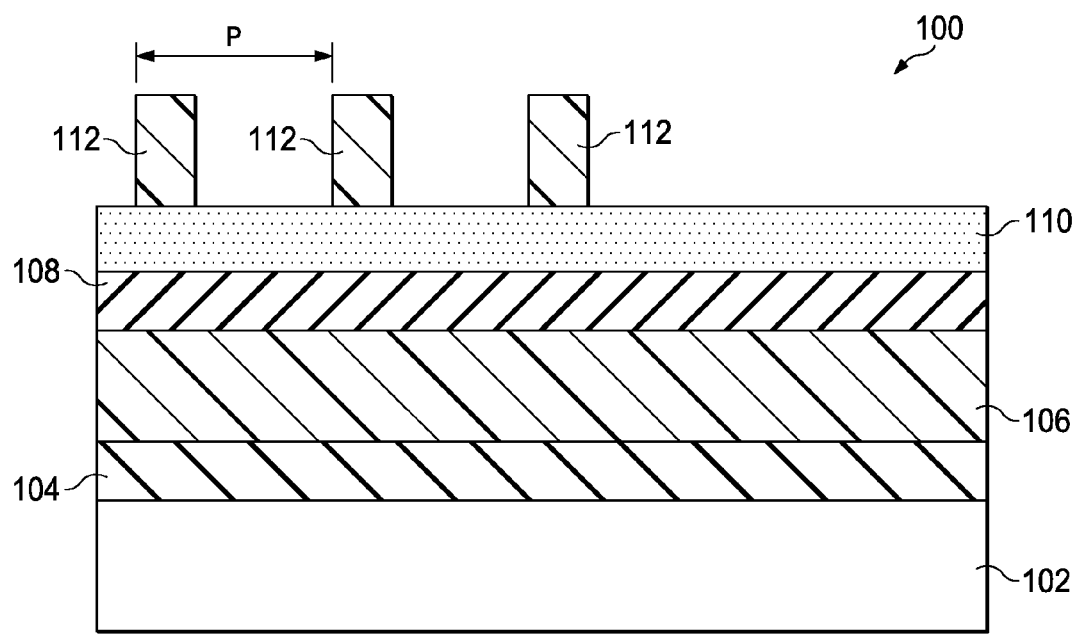

FIG. 2 illustrates the patterning of top photoresist layer 112 using any suitable photolithography technique. For example, a photomask (not shown) may be disposed over top photoresist layer 112, which may then be exposed to radiation such as ultraviolet light or an exciser laser. Exposure of top photoresist layer 112 may be performed using an immersion lithography system (e.g., a 193 nm immersion lithography system) to increase resolution and decrease the minimum achievable pitch. A bake or cure operation may be performed to harden top photoresist layer 112, and a developer may be used to remove either the exposed or unexposed portions of the layer 112 depending on whether a positive or negative resist is used. Thus, a pattern such as the pattern illustrated in FIG. 2 is formed in top photoresist layer 112. The patterned portions of top photoresist layer 112 may be spaced apart from each other at a pitch P. Pitch P may be a minimum pitch (i.e., the smallest pitch the photolithographic system can achieve) and may be, for example, about 80 nm. The pattern of photoresist layer 112 in FIG. 2 is for illustrative sake only, and other patterns may be formed depending on the design of semiconductor device 100.

Figure 3:
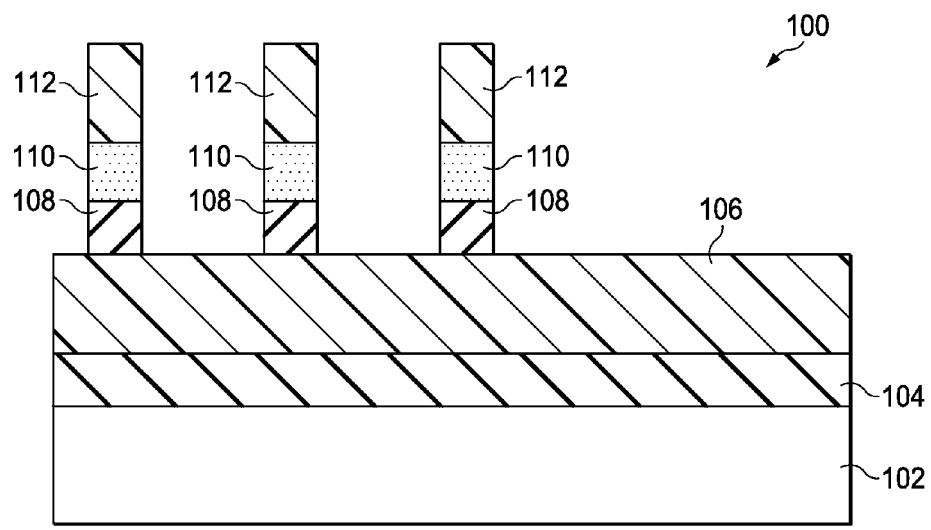
Figure 4:
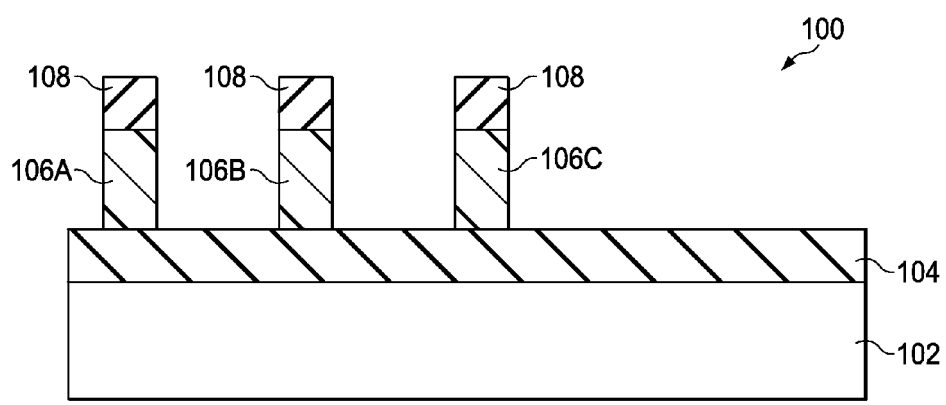

FIG. 3 illustrates the transferring of the pattern of top photoresist layer 112 to bottom layer 110 and a dielectric hard mask layer 108, respectively. Dielectric hard mask layer 108 may be formed of any suitable material, such as, a nitride (e.g., SiON). The pattern transfer may be done, for example, using a selective etchant process. Subsequently, top and bottom layers 112 and 110 may be etched using, e.g., a trimming process such as anisotropic plasma etch process. Portions of dielectric hard mask layer 108 may also be removed as part of the trimming process to achieve a more stable, aspect-ratio for subsequent etching steps. Referring now to FIG. 4, dummy layer 106 may be etched using bi-layer photoresist 114 and dielectric hard mask layer 108 as a patterning mask, forming dummy lines 106A, 106B, and 106C (sometimes referred to as mandrels 106A-106C).

Figure 5A:
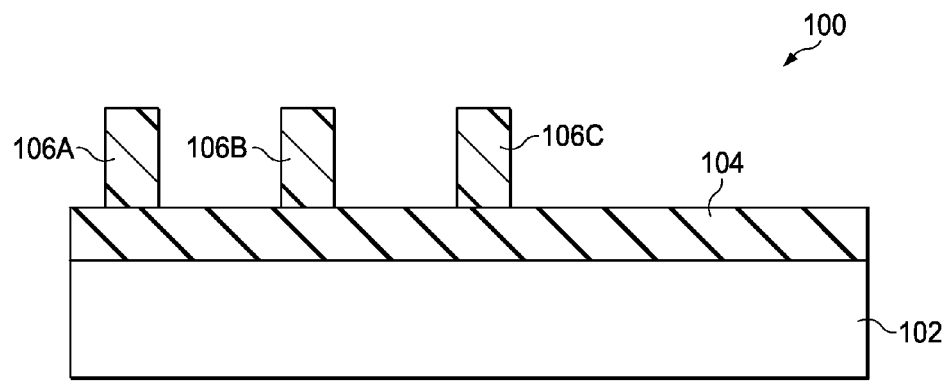

In FIG. 5A, bi-layer photoresist 114 and dielectric hard mask layer 108 may then be removed by applying, for example, an ashing process and a wet clean process to clean the remainder of dielectric hard mask layer 108 from the patterned dummy layer 106 lines. The use of bi-layer photoresist 114 and the dielectric hard mask layer 108 to pattern dummy layer 106 allows for dummy lines 106A-106C to have evenly spaced, substantially rectangular profiles for the stable formation of a sidewall aligned spacer in a subsequent process step. Other techniques for patterning dummy layer 106 may also be used.

Figure 5B:
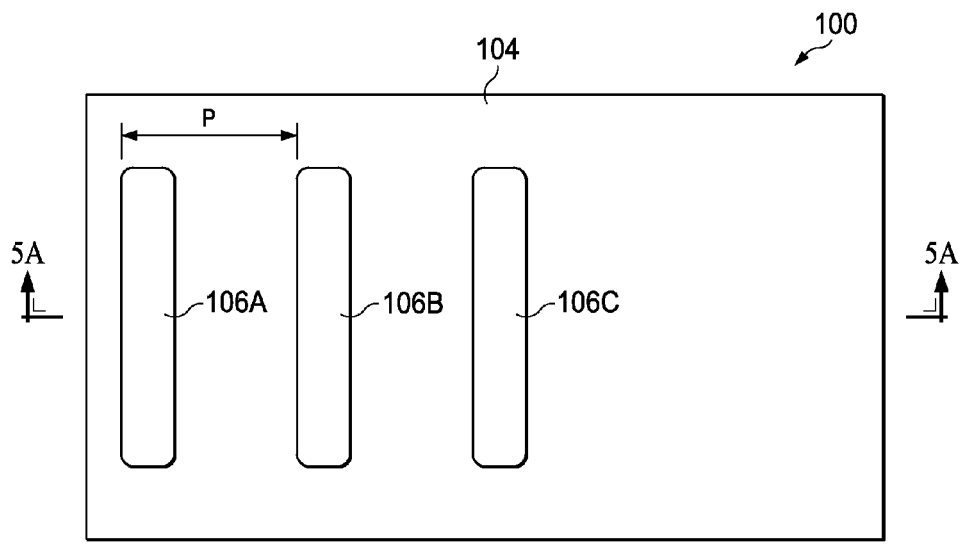

FIG. 5B illustrates a top down view of the semiconductor device 100 illustrated in FIG. 5A. As shown in FIG. 5B, a plurality of dummy lines 106A, 106B, and 106C run in parallel corresponding to a pattern defined by bi-layer photoresist 114. Patterned dummy lines 106A-106C may be spaced apart from each other by pitch P (e.g., 80 nm). Although three dummy lines are illustrated in FIGS. 5A and 5B, various embodiments may include a different number of dummy lines depending on the patterning of bi-layer photoresist 114 and the design of semiconductor device 100.

Figure 6A:
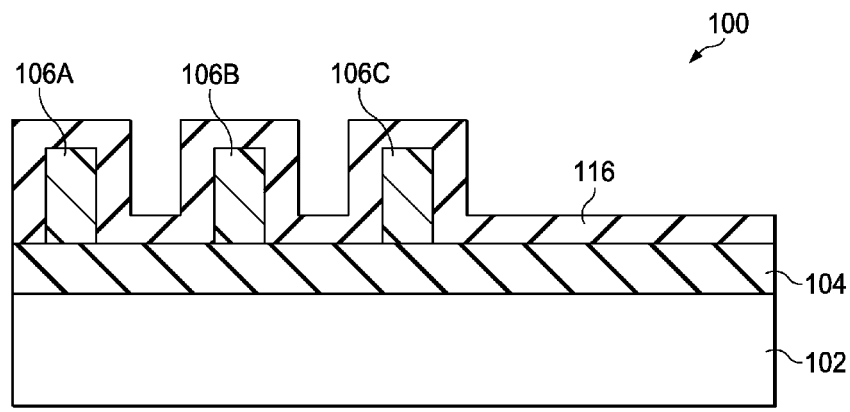

FIG. 6A illustrates the formation of a sidewall aligned spacer 116 over dummy lines 106A-106C and hard mask 104. Spacer 116 may be conformably formed over dummy lines 106A-106C using any suitable method such as atomic layer deposition (ALD), CVD, low pressure CVD, or the like. The material used for spacer 116 may have a high selectivity that is greater than materials deposited for subsequent patterning steps (e.g., illustrated in FIGS. 7-16). That is, the material of spacer 116 may have a high selectivity (e.g., greater than 5 or 6) so that subsequent etching steps may be performed on materials over spacer 116 without significantly attacking the material of spacer 116. Thus, spacer 116 may also be referred to as a high selectivity spacer. In various embodiments, spacer 116 may be formed of titanium nitride (TiN), titanium oxide (TiO), or the like. Furthermore, the thickness of spacer 116 may be selected to determine the thickness of features eventually formed in semiconductor device layer 102.

Figure 6B:
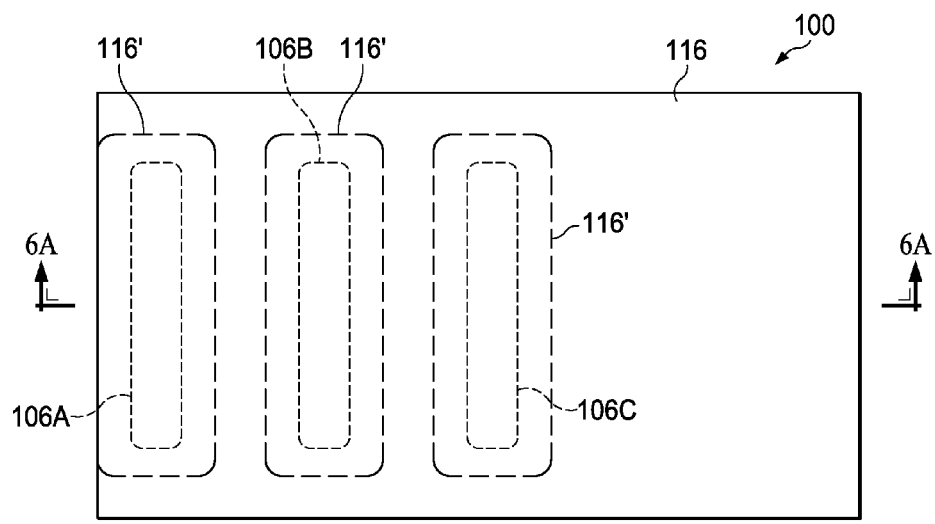

FIG. 6B illustrates a top-down view of the semiconductor device 100 shown in FIG. 6A. Spacer 116 conformably covers a top surface of semiconductor device 100. Dummy lines 106A-106C are illustrated in ghost in FIG. 6B for reference. Raised edges of spacer 116 around dummy lines 106A-106C are indicated by dashed outlines 116'. As shown in FIG. 6B, spacer 116 may be formed around all four sides of dummy lines 106A-106B uniformly.

Figure 7:
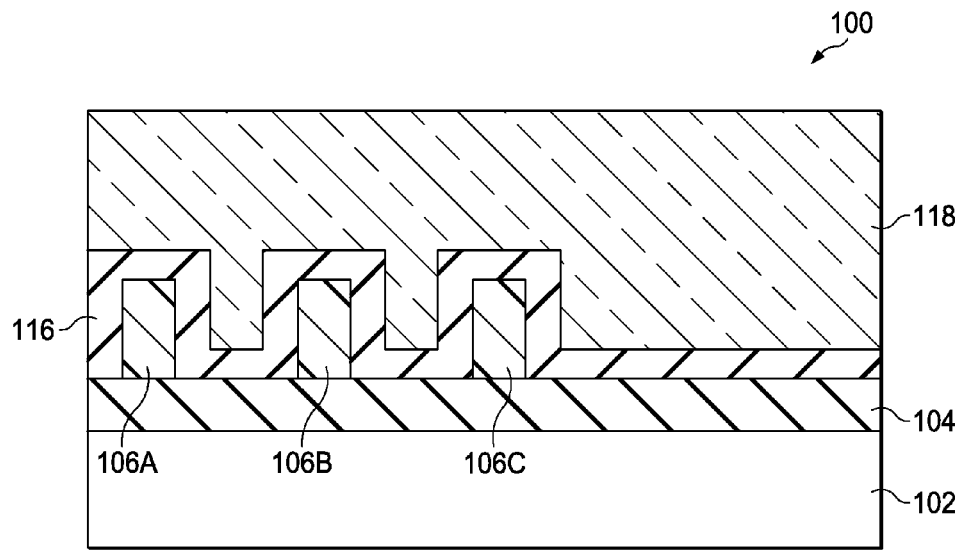

Referring now to FIG. 7, a reverse material layer 118 may be formed over spacer 116. In various embodiments, reverse material layer 118 may be spun on glass (SOG) or any other suitable material.

Figure 8A:
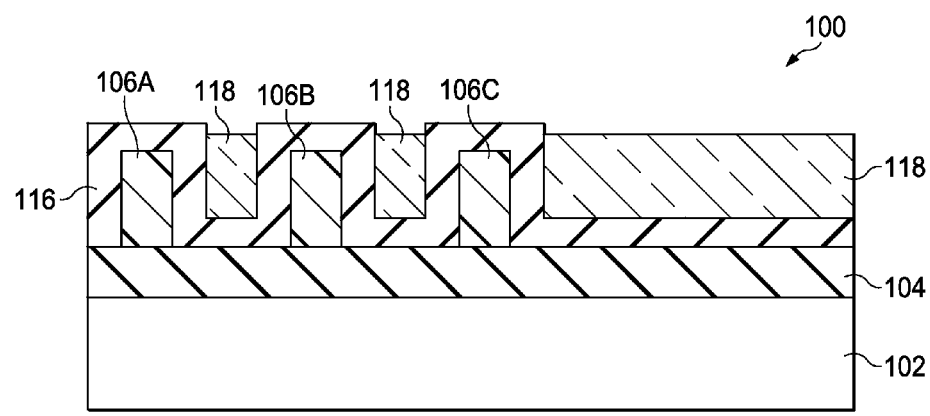
Figure 8B:
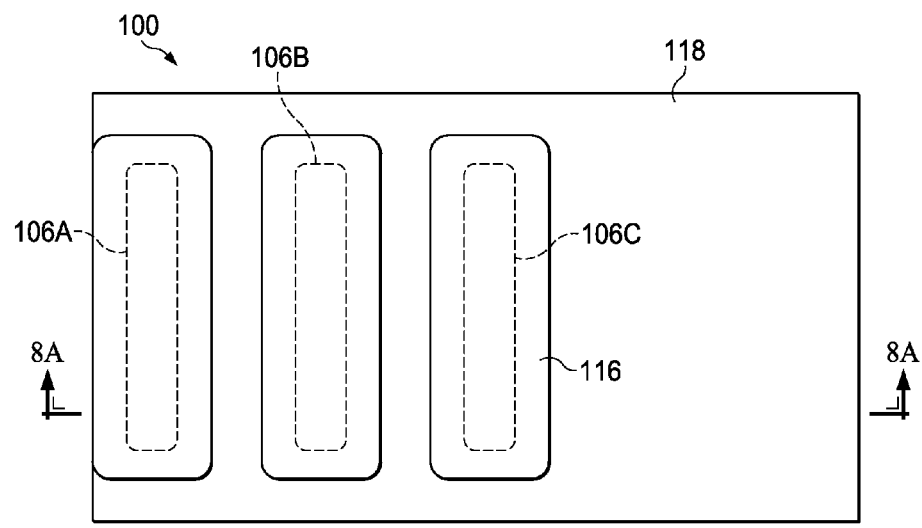

In FIG. 8A, top portions of reverse material layer 118 may be etched back to expose top surfaces of spacer 116, using, for example an anisotropic etching technique. Notably, a top surface reverse material layer 118 may be lower than, and not level with, a top surface of spacer 116. FIG. 8B illustrates a top down view of semiconductor device 100 shown in FIG. 8A. As illustrated in FIG. 8B, the etch back of reverse material layer 118 exposes the portions of spacer 116 surrounding dummy lines 106A-106C (shown in ghost for reference).

Figure 9:
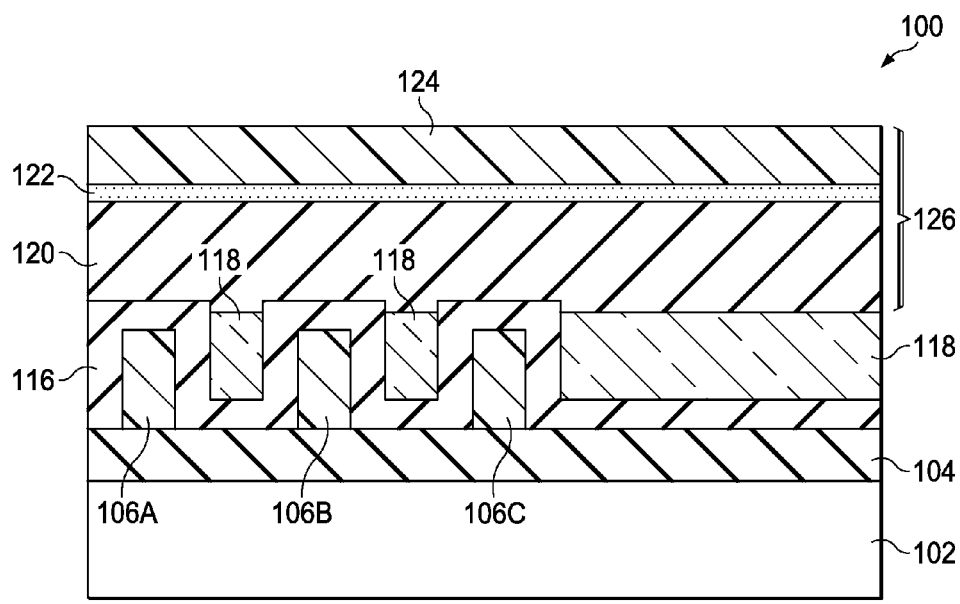

FIG. 9 illustrates the formation of a tri-layer photoresist 126 over spacer 116 and reverse material layer 118. Tri-layer photoresist 126 includes a relatively thin top photoresist layer 124, a middle layer 122, and a bottom layer 120. As the limits of photolithography processes are reached by advanced semiconductor manufacturing processes, the need for thinner top photoresist layers has arisen to achieve smaller process windows. However, thin top photoresist layers may not be sufficiently robust to support the etching of target layers. A tri-layer photoresist provides a relatively thin top photoresist layer 124. Tri-layer photoresist 126 further includes a middle layer 122, which may include silicon-containing photoresist materials to increase the selectivity of bottom layer 120. Tri-layer photoresist 126 further includes a bottom layer 120, which may comprise a photoresist spin-on material. Thus, tri-layer photoresist 126 allows for the robust patterning of underlying layers (e.g., dummy layer 118) while still providing a relatively thin top photoresist layer 124.

Figure 10A:
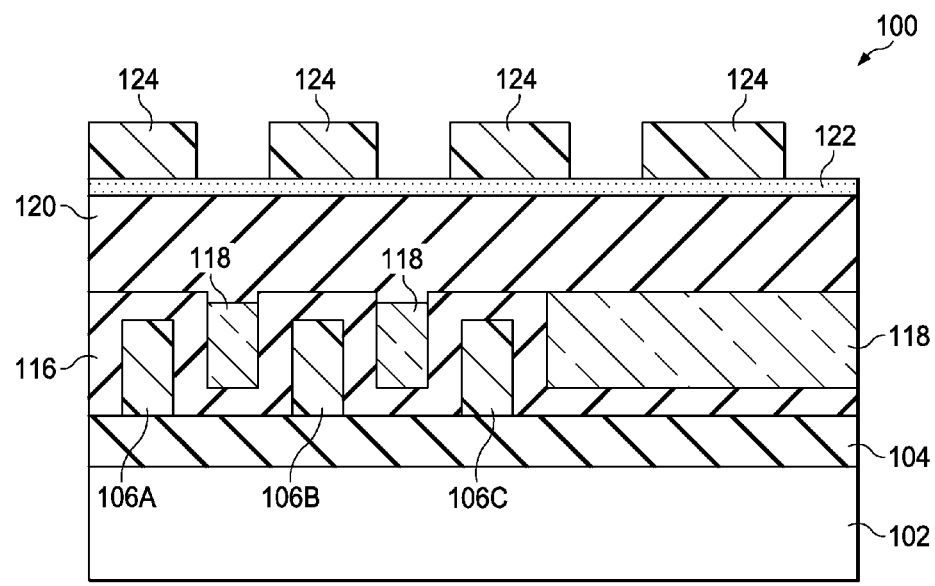
Figure 10B:
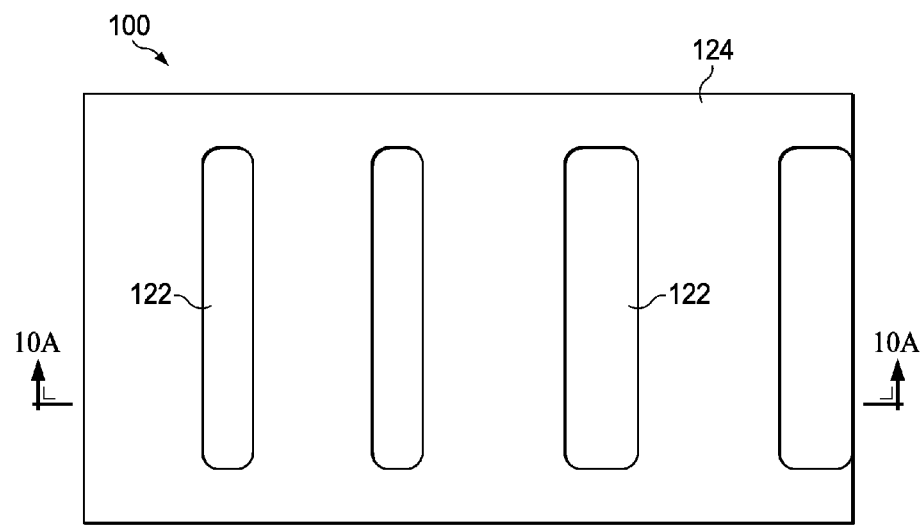

FIGS. 10A and 10B illustrate the patterning of top photoresist layer 124. FIG. 10A shows a cross-sectional view, and FIG. 10B shows a top-down view. The cross-sectional view illustrated in FIG. 10A may be taken across the line 10A/10A of FIG. 10B. The patterning of top photoresist layer 124 may be achieved, for example, by using an immersion photolithography system (e.g., a 193i system) to expose portions of top photoresist layer 124 and developing the exposed/unexposed portions depending on whether a positive/negative photoresist is used. Top photoresist layer 124 may be patterned to not cover certain areas of reverse material layer 118, including portions between dummy lines 106A and 106C. Additional portions of reverse material layer 118 may also be uncovered, which may be used to eventually transfer patterns of varying dimensions to hard mask 104 in subsequent process steps.

Figure 11A:
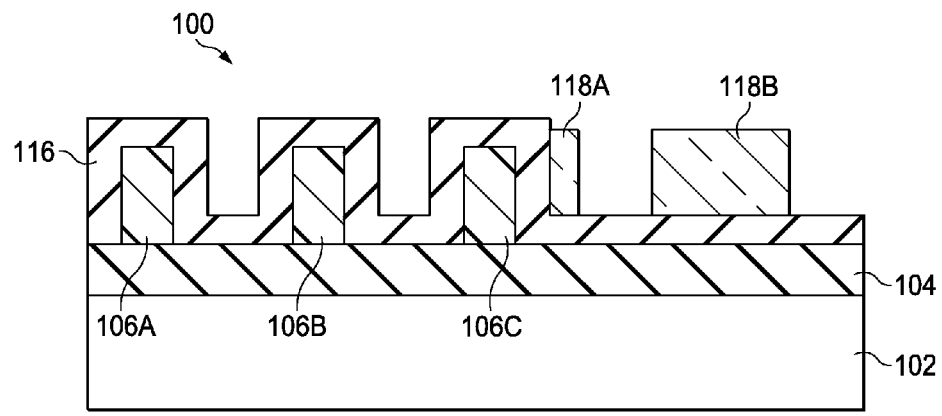
Figure 11B:
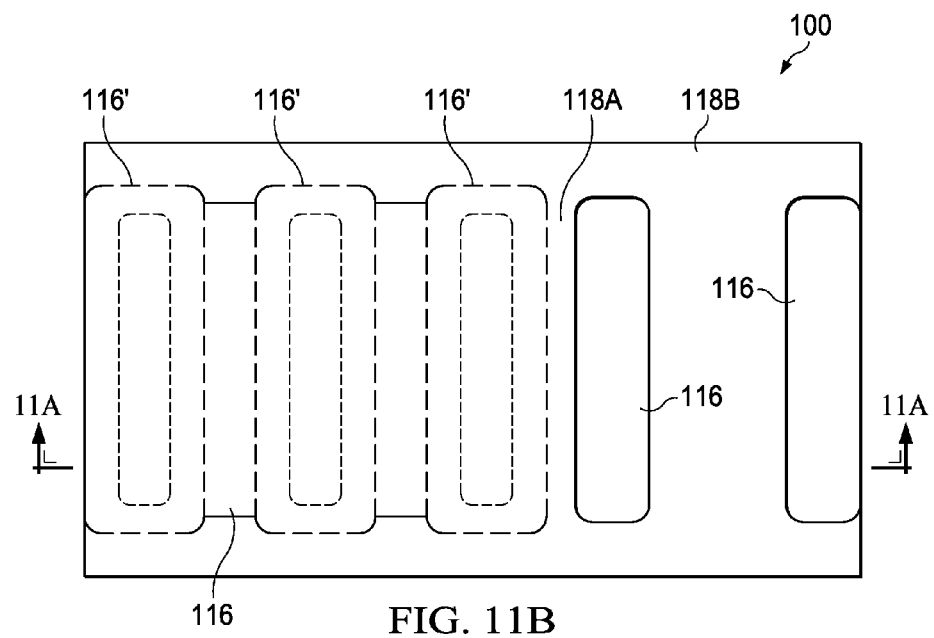

FIGS. 11A and 11B illustrate the patterning of reverse material layer 118 using tri-layer photoresist 126. FIG. 11A shows a cross-sectional view of semiconductor device 100 taken across the line 11A/11A of the top-down view illustrated in FIG. 11B. Reverse material layer 118 may be selectively patterned, for example, by selectively etching reverse material layer 118 using tri-layer photoresist 126 as a patterning mask. The chemical etchant used may be selected to etch only reverse material layer 118 without significantly etching spacer 116. For example, tetrafluoromethane ($CF_4$), trifluoromethane ($CHF_3$), difluoromethane ($CH_2F_2$), octafluorocyclobutane ($C_4F_8$), or the like may be used to selectively etch the material of reverse material layer 118 (e.g., SOG) because $C_xF_y$ may not significantly attack the high selectivity material of spacer 116 (e.g., TiN or TiO). Other suitable chemical etchants may also be used. Thus, reverse material layer 118 may be patterned directly without the use of multiple planarization processes.

The remaining patterned portions of reverse material layer 118 may be referred to as a line B pattern. This line B pattern may be used to transfer features of varying dimensions (e.g., widths) to hard mask 104 and semiconductor device layer 102 in subsequent process steps. Portions of the line B pattern (e.g., 118A) pattern may be used to increase the width of spacer 116 while other portions of the line B pattern (e.g., 118B) may be used to create new pattern features of a different width than spacer 116. The patterns shown in FIGS. 11A and 11B are for illustrative purposes only and different patterns may be formed depending on the design of semiconductor device 100.

Figure 12A:
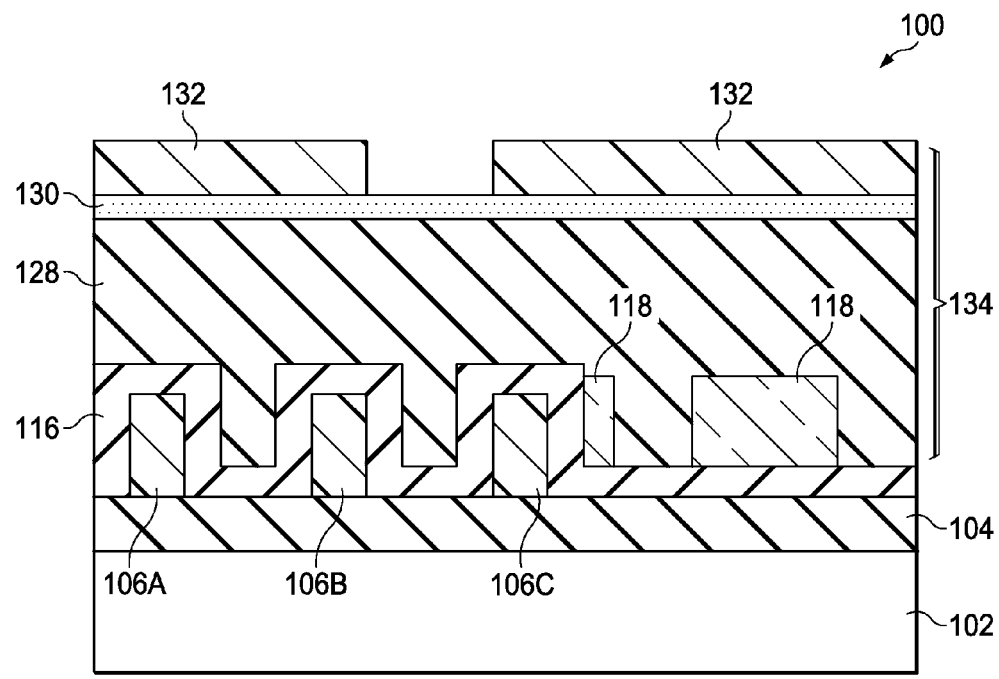
Figure 12B:
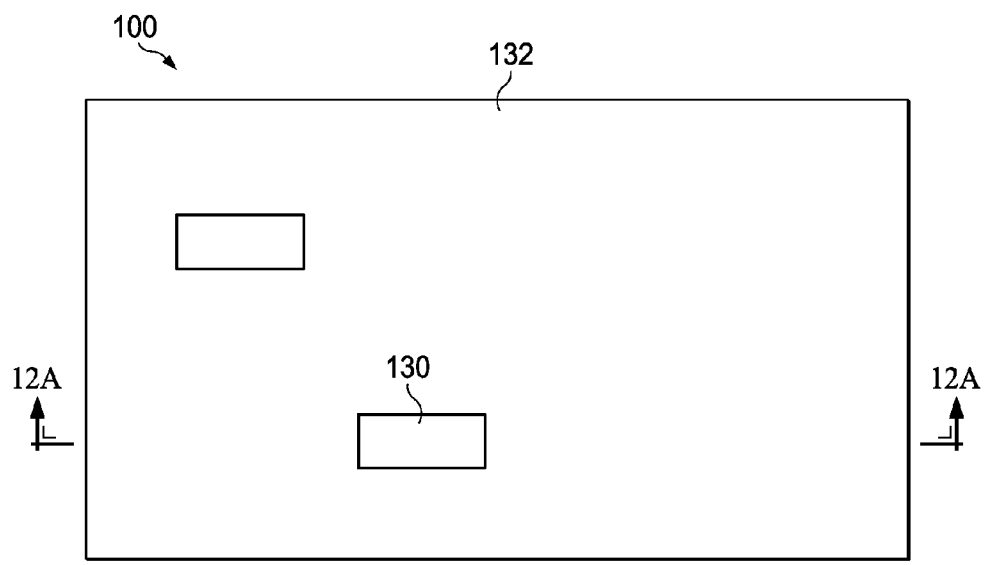

FIGS. 12A and 12B illustrate the formation of a tri-layer photoresist 134 and the patterning of a top photoresist layer 132. Tri-layer photoresist 134 may be substantially similar to tri-layer photoresist 126 and includes a relatively thin top photoresist layer 132, a middle layer 130, and a bottom layer 128. FIG. 12A shows a cross-sectional view, and FIG. 12B shows a top-down view. The cross-sectional view illustrated in FIG. 12A may be taken across the line 12A/12A of FIG. 12B. The patterning of top photoresist layer 132 may be achieved, for example, using an immersion photolithography system (e.g., a 193i system) to expose portions of top photoresist layer 132 and developing the exposed/unexposed portions depending on whether a positive/negative photoresist is used.

Top photoresist layer 132 may be patterned create openings over semiconductor device 100. These openings, which may be referred to as cut B patterns, may be used to eventually transfer more complex patterns, for example, in a perpendicular direction to patterns of spacer 116 and the line B pattern to hard mask 104 or to form different pattern shapes in subsequent process steps. Because the line B pattern is defined by a separate lithography step (e.g., as illustrated by FIGS. 11A and 11B), the line B pattern is not limited by the pattern and width of spacers 116. Thus, various embodiments provide additional flexibility in forming the line B pattern through lithography and optional cut B patterning, for example, to provide for patterns of varying widths and shapes.

Figure 13:
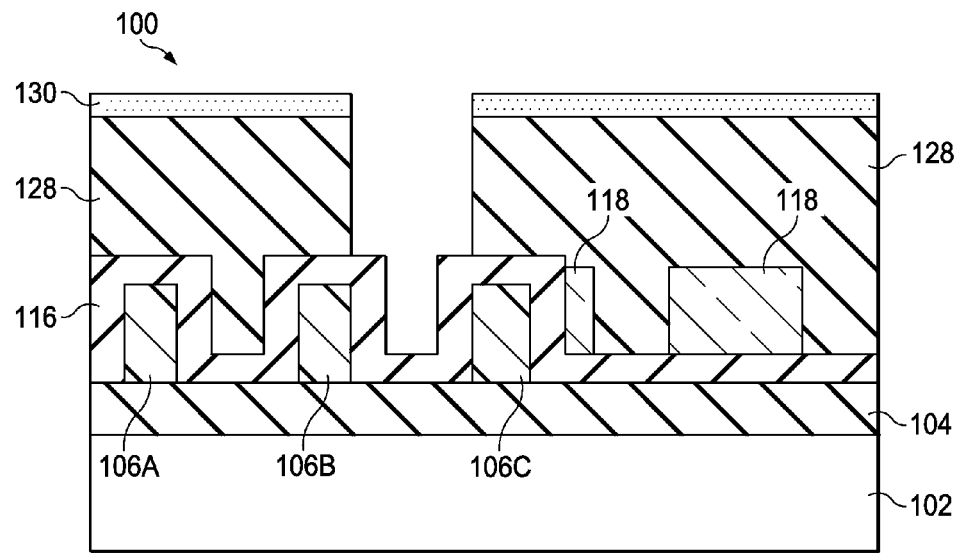

FIG. 13 illustrates the etching of bottom layer 128 using top photoresist layer 132 and middle layer 130 as a mask. The chemical etchant used on bottom layer 128 may be selected to etch only bottom layer 128, without significantly etching spacer 116. For example, tetrafluoromethane ($CF_4$) may be used to selectively etch the material of bottom layer 128 (e.g., SiON) as $CF_4$ may not significantly attack the higher selectivity material of spacer 116 (e.g., TiN or TiO). As bottom layer 128 is etched, top photoresist layer 132 may be simultaneously etched away. Thus, after the etching, top photoresist layer 132 may have been removed as a result of the etching.

Figure 14:
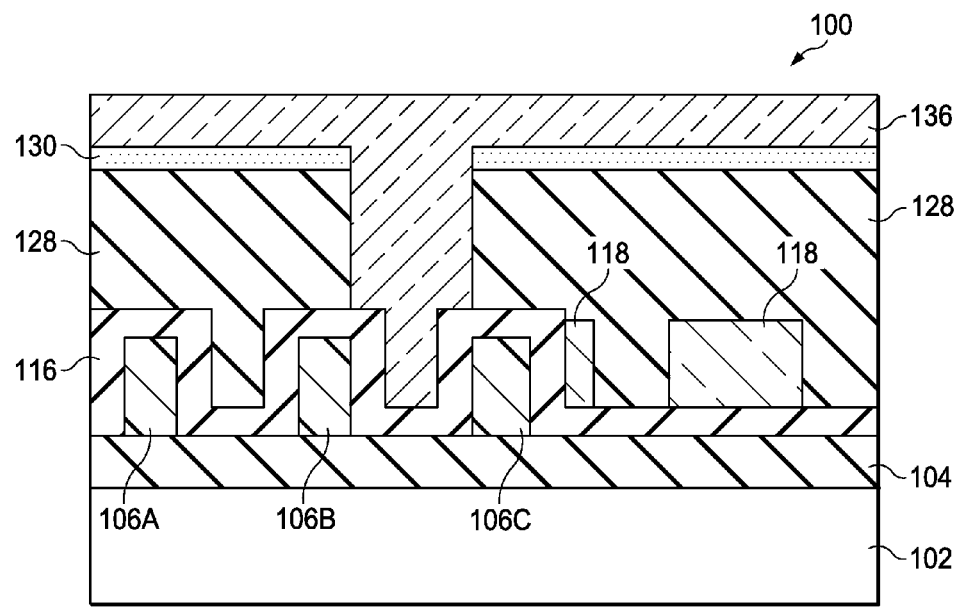

FIG. 14 illustrates the coating of a reverse material layer 136 over semiconductor device 100, filling openings in bottom layer 128. Reverse material layer 136 may be substantially similar to reverse material layer 118. For example, reverse material layer 136 may be formed of spin on glass (SOG).

Figure 15A:
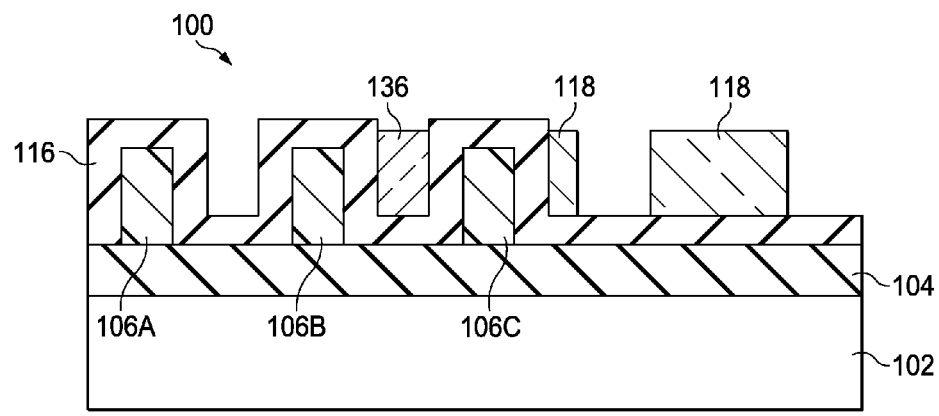
Figure 15B:
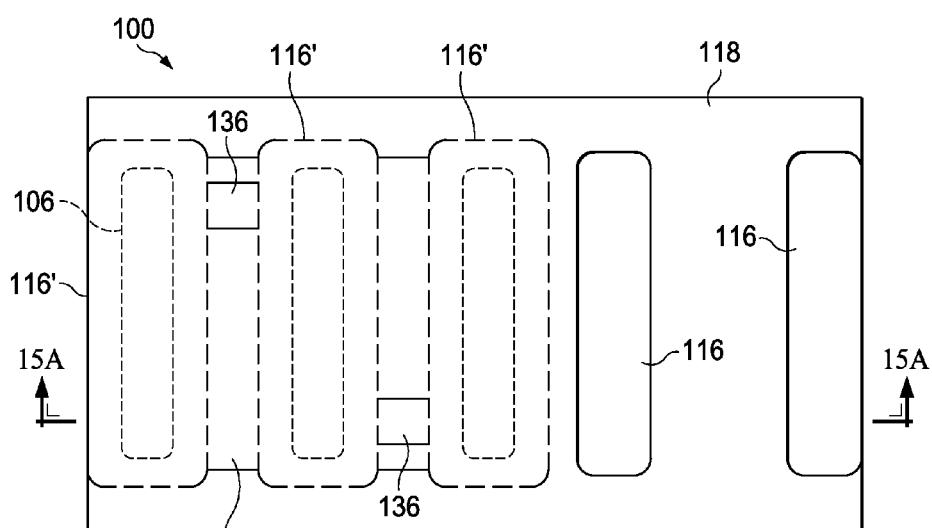

FIGS. 15A and 15B illustrate the removal of tri-layer photoresist 134 and the etch back of reverse material layer 136. FIG. 15A shows a cross-sectional view taken across the line 15A/15A of the top-down view illustrated in FIG. 15B. Tri-layer photoresist 134 may be removed, for example, using a combination of ashing and wet clean processes. The etch back of top portions of reverse material layer 136 exposes top surfaces of spacer 116, and may be performed, for example, using an anisotropic etching technique. Notably, a top surface reverse material layer 136 may be lower than, and not level with, a top surface of spacer 116. Furthermore, reverse material layer 136 forms more complex patterned portions, for example, that run in a direction perpendicular to and connecting portions of spacer 116 or to form varying shapes and widths. The exact pattern of reverse material layer 136 may vary in various embodiments depending on the design of semiconductor device 100. Alternatively, the formation and patterning of a second reverse material layer 136 (e.g., as illustrated in FIGS. 12A-15B) may be excluded in certain patterning processes, for example, involving less complex patterning.

Figure 16A:
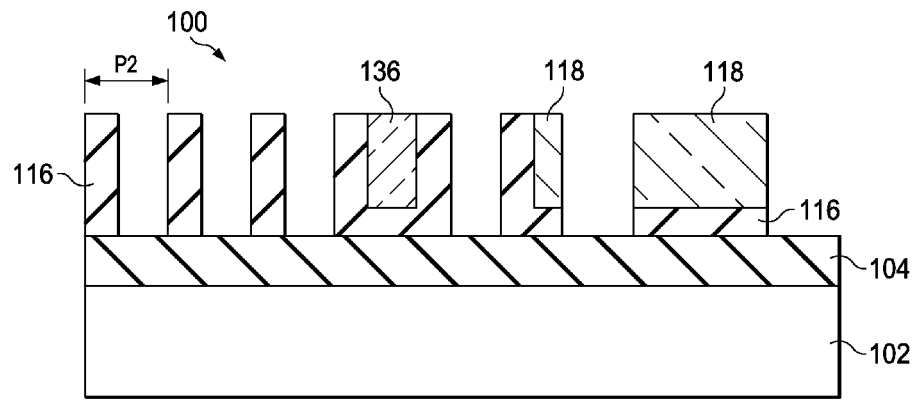
Figure 16B:
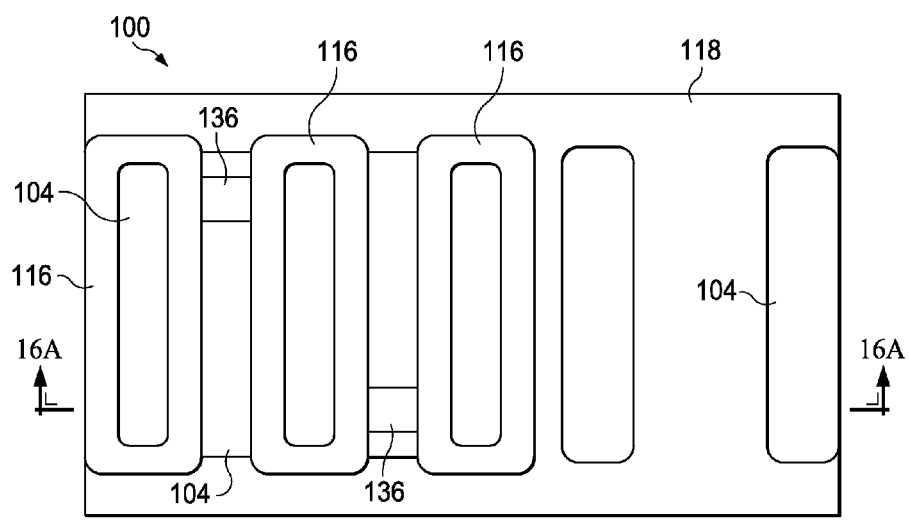

FIGS. 16A and 16B illustrate etch back of spacer 116 and the removal of dummy lines 106. FIG. 16A shows a cross-sectional view taken across the line 16A/16A of the top-down view illustrated in FIG. 16B. Top portions of spacer 116 may be anisotropically etched to expose underlying dummy lines 106 and hard mask 104. The chemical etchant used to etch spacers 116 may be selected based on the higher selectivity spacer material. For example, top surfaces of spacer 116 may be etched using chlorine as an etchant. Dummy lines 106 may be removed using, for example, an oxygen-plasma ashing process. Subsequently, a wet clean process may also be applied to semiconductor device 100 to remove residual spacer and dummy line material. The remaining spacer 116 and reverse material layers 118 and 136 form a mask for transferring a pattern onto hard mask 104. Reverse material layer 118 creates a pattern of varying dimensions (e.g., width) compared to the uniform dimension of spacer 116. The formation and patterning of reverse material layer 136 may be used to create a more complex pattern, for example, in a direction perpendicular to spacer 116.

Figure 17A:
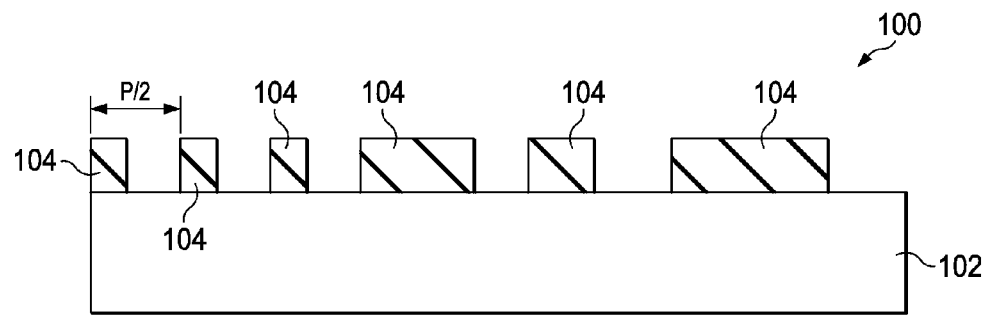
Figure 17B:
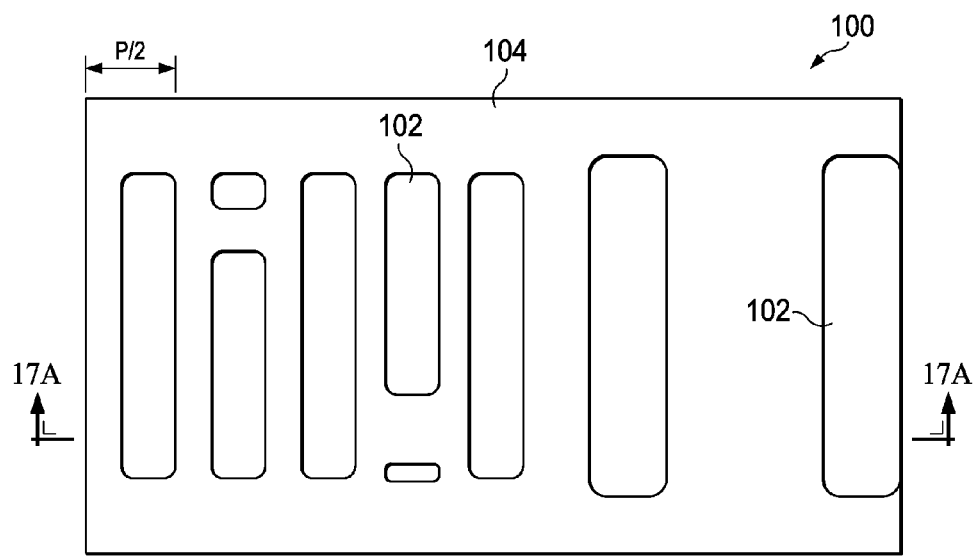

FIGS. 17A and 17B illustrate the patterning of hard mask 104. FIG. 17A shows a cross-sectional view taken across the line 17A/17A of the top-down view illustrated in FIG. 17B. Hard mask 104 is patterned using spacer 116, reverse material layer 118 (i.e., line B pattern), and reverse material layer 136 (i.e., cut B pattern) as a mask. Alternatively, in processes that do not include reverse material layer 136 (i.e., cut B patterns), spacer 116 and reverse material layer 118 may be used to pattern hard mask 104. Any suitable chemical, for example, $CF_4$ may be used to etch hard mask 104. In a subsequently process step (not shown), hard mask 104 may be used to transfer the illustrated pattern to semiconductor device layer 102, for example, through an etching process using hard mask 104 as a patterning mask.

The pattern of hard mask 104 may be spaced at about half the pitch of dummy lines 106. For example, if a minimum pitch (e.g., 80 nm) was used to pattern dummy lines 106, then the features of hard mask 104 may be spaced at about half the minimum pitch (e.g., 40 nm). Thus, though the use of the intermediary steps illustrated in FIGS. 1-17B, a hard mask may be patterned having a high resolution and small pitch while containing patterns having varying dimensions (e.g., width). The patterns may also optionally include more complex portions, for example, aligned in different directions. Furthermore, through the use of a highly selective material for the sidewall aligned spacer, reverse material layers may be patterned directly, eliminating the need for multiple planarization processes and lowering manufacturing cost.

In accordance with an embodiment, a method for patterning a semiconductor device includes patterning a dummy layer over a hard mask to form one or more dummy lines. A sidewall aligned spacer is conformably formed over the one or more dummy lines and the hard mask. A reverse material layer is formed over the sidewall aligned spacer. A photoresist is formed and patterned over the first reverse material layer. The reverse material layer is selectively etched using the first photoresist as a mask, wherein the sidewall aligned spacer is not etched. The one or more dummy lines are removed, and the hard mask is patterned using the sidewall aligned spacer and the first reverse material layer as a mask. A material used for forming the sidewall aligned spacer has a higher selectivity than a material used for forming the first reverse material layer.

In accordance with another embodiment, a method for patterning a semiconductor device includes forming dummy lines over a hard mask and conformably forming a high selectivity spacer over the dummy lines. A first reverse material layer is formed over the high selectivity spacer. The first reverse material layer is etched back to expose a top surface of the high selectivity spacer. A photoresist is formed and patterned over the first reverse material layer. The first reverse material layer is selectively etched using the photoresist as a mask. A second reverse material layer is formed over portions of the high selectivity spacer. The dummy lines are removed, and the hard mask is patterned using the high selectivity spacer, the first reverse material layer, and the second reverse material layer as a mask In accordance with yet another embodiment, a method for patterning a semiconductor device includes patterning a dummy layer over a hard mask layer in the semiconductor device to form one or more dummy lines and conformably forming a high selectivity spacer over the one or more dummy lines and the hard mask. A first reverse material layer is formed over the high selectivity spacer and etched back to a level below a top surface of the high selectivity spacer. A photoresist is patterned over the first reverse material layer. The first reverse material layer is selectively patterned using the photoresist as a mask, wherein the high selectivity spacer is not patterned. A second reverse material layer is formed over portions of the high selectivity spacer, wherein a top surface of the second reverse material layer is lower than a top surface of the high selectivity spacer. A top portion of the high selectivity spacer is etched back to expose the one or more dummy lines and portions of the hard mask. The dummy lines are removed, and the hard mask is patterned using the high selectivity spacer and the first and second reverse material layers as a mask Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for patterning a semiconductor device comprising:
    patterning a dummy layer over a hard mask to form one or more dummy lines;
    forming a sidewall aligned spacer conformably over the one or more dummy lines and the hard mask;
    forming a first reverse material layer over the sidewall aligned spacer, wherein a material used for forming the sidewall aligned spacer has a higher selectivity than a material used for forming the first reverse material layer;
    forming a first photoresist over the first reverse material layer;
    patterning the first photoresist;
    selectively etching the first reverse material layer using the first photoresist as a mask, wherein the sidewall aligned spacer is not etched;
    removing the one or more dummy lines; and
    patterning the hard mask using the sidewall aligned spacer and the first reverse material layer as a mask.

2. The method of claim 1, wherein the material used for forming the sidewall aligned spacer is titanium nitride or titanium oxide.

3. The method of claim 1, wherein the material used for forming the first reverse material layer is spin on glass (SOG).

4. The method of claim 1, wherein the patterning the dummy layer comprises using a bi-layer photoresist.

5. The method of claim 1, wherein the first photoresist is a tri-layer comprising a top photoresist layer, a middle layer, and a bottom layer, wherein the middle layer comprises a silicon-containing photoresist material, and wherein the middle layer comprises a photoresist material.

6. The method of claim 1, wherein the removing the one or more dummy lines comprises:
    etching back a top portion of the sidewall aligned spacer to expose the one or more dummy lines and portions of the hard mask; and
    using an ashing process to remove the one or more dummy lines.

7. The method of claim 6, wherein the etching back the top portion of the sidewall aligned spacer comprises using chlorine as a chemical etchant.

8. The method of claim 1 further comprises etching back a top portion of the first reverse material layer to a level below a top surface of the sidewall aligned spacer before forming the first photoresist.

9. The method of claim 1, wherein the selectively etching the first reverse material layer comprises using tetrafluoromethane, trifluoromethane, difluoromethane, or octafluorocyclobutane as a chemical etchant.

10. The method of claim 1 further comprising, after the selectively etching the first reverse material layer:
    forming a second photoresist over the sidewall aligned spacer;
    forming one or more openings in the second photoresist, exposing the sidewall aligned spacer;
    forming a second reverse material layer in the one or more openings;
    removing the second photoresist; and etching back a top portion of the second reverse material layer to a level below a top surface of the sidewall aligned spacer.

11. The method of claim 1, wherein the dummy layer is formed of an ashable hard mask.

12. The method of claim 1, wherein the patterning the dummy layer comprises patterning the dummy layer at a minimum pitch achievable by a photolithography system.

13. The method of claim 1, wherein the patterning the hard mask comprises patterning features of the hard mask at about half a pitch of the dummy lines.

14. A method for patterning a semiconductor device comprising:
   forming dummy lines over a hard mask;
   conformably forming a high selectivity spacer over the dummy lines;
   forming a first reverse material layer over the high selectivity spacer;
   etching back the first reverse material layer to expose a top surface of the high selectivity spacer;
   forming and patterning a photoresist over the first reverse material layer;
   selectively etching the first reverse material layer using the photoresist as a mask;
   forming a patterned second reverse material layer over portions of the high selectivity spacer;
   removing the dummy lines;
   exposing portions of the hard mask; and
   patterning the hard mask using the high selectivity spacer, the first reverse material layer, and the second reverse material layer as a mask.

15. The method of claim 14, wherein the conformably forming the high selectivity spacer comprises forming the high selectivity spacer of titanium nitride or titanium oxide.

16. The method of claim 14, wherein the first and second reverse material layers are formed of spin on glass.

17. The method of claim 14, wherein the patterning the hard mask comprises using the first reverse material layer to form features of a different width than the high selectivity spacer.

18. The method of claim 14, wherein the patterning the hard mask comprises using the second reverse material layer to forms features in a perpendicular direction to the high selectivity spacer.

19. A method for patterning a semiconductor device comprising:
   patterning a dummy layer over a hard mask layer in the semiconductor device to form one or more dummy lines;
   conformably forming a high selectivity spacer over the one or more dummy lines and the hard mask;
   forming a first reverse material layer over the high selectivity spacer;
   etching back a top portion of the first reverse material layer to a level below a top surface of the high selectivity spacer;
   patterning a photoresist over the first reverse material layer;
   selectively etching the first reverse material layer using the photoresist as a mask, wherein the high selectivity spacer is not etched;
   forming a second reverse material layer over portions of the high selectivity spacer, wherein a top surface of the second reverse material layer is lower than a top surface of the high selectivity spacer;
   etching back a top portion of the high selectivity spacer to expose the one or more dummy lines and exposing portions of the hard mask;
   removing the dummy lines; and
   patterning the hard mask using the high selectivity spacer and the first and second reverse material layers as a mask.

20. The method of claim 19, wherein the forming the high selectivity spacer comprises forming the high selectivity spacer of titanium nitride or titanium oxide.

* * * * *